(12) United States Patent
Komai

(10) Patent No.: US 10,049,751 B2
(45) Date of Patent: Aug. 14, 2018

(54) SEMICONDUCTOR MEMORY DEVICE

(71) Applicant: TOSHIBA MEMORY CORPORATION, Minato-ku (JP)

(72) Inventor: Hiromitsu Komai, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/432,287

(22) Filed: Feb. 14, 2017

(65) Prior Publication Data

US 2017/0154658 A1 Jun. 1, 2017

Related U.S. Application Data

(63) Continuation of application No. PCT/JP2014/072611, filed on Aug. 28, 2014.

(51) Int. Cl.
| | |
|---|---|
| G11C 7/10 | (2006.01) |
| G11C 16/26 | (2006.01) |
| G11C 16/04 | (2006.01) |
| G11C 16/08 | (2006.01) |

(52) U.S. Cl.
CPC ............ G11C 16/26 (2013.01); G11C 7/1051 (2013.01); G11C 16/0483 (2013.01); G11C 16/08 (2013.01); *G11C 7/106* (2013.01)

(58) Field of Classification Search
CPC ... G11C 16/26; G11C 16/0483; G11C 7/1051; G11C 7/106; G11C 11/413; G11C 7/10; G11C 16/08
USPC ............ 365/185.05, 189.05, 189.15, 190, 63
See application file for complete search history.

(56) References Cited

U.S. PATENT DOCUMENTS

| | | | | |
|---|---|---|---|---|
| 5,539,691 | A * | 7/1996 | Kozaru | G11C 7/1051 365/189.05 |
| 5,982,689 | A | 11/1999 | Takahashi | |
| 6,330,189 | B1 | 12/2001 | Sakui et al. | |
| 6,536,003 | B1 * | 3/2003 | Gaziello | G11C 29/24 365/201 |
| 8,363,486 | B2 | 1/2013 | Abiko | |
| 8,755,236 | B2 * | 6/2014 | Shiah | G11C 7/1087 341/100 |
| 2003/0117182 | A1 | 6/2003 | Shionoiri et al. | |
| 2008/0130387 | A1 * | 6/2008 | Kuang | G11C 29/50 365/201 |

(Continued)

FOREIGN PATENT DOCUMENTS

| | | |
|---|---|---|
| JP | 3220027 | 10/2001 |
| JP | 3886673 | 2/2007 |

(Continued)

OTHER PUBLICATIONS

International Search Report dated Nov. 11, 2014 in PCT/JP2014/072611 filed Aug. 28, 2014 (with English translation).

(Continued)

*Primary Examiner* — Tan T. Nguyen
(74) *Attorney, Agent, or Firm* — Oblon, McClelland, Maier & Neustadt, L.L.P.

(57) ABSTRACT

According to one embodiment, a semiconductor memory device includes a plurality of data latches; and an inverter shared by the plurality of data latches. The inverter is inserted between complementary buses that sandwich the plurality of data latches.

19 Claims, 9 Drawing Sheets

(56) References Cited

U.S. PATENT DOCUMENTS

| | | |
|---|---|---|
| 2008/0273386 A1 | 11/2008 | Pyeon |
| 2011/0141814 A1 | 6/2011 | Abiko |
| 2013/0021853 A1* | 1/2013 | Yoo .................. G11C 16/06 |
| | | 365/189.05 |
| 2013/0064028 A1 | 3/2013 | Kawasumi |

FOREIGN PATENT DOCUMENTS

| | | |
|---|---|---|
| JP | 4223214 | 2/2009 |
| JP | 2010-526393 | 7/2010 |
| JP | 2011-129176 | 6/2011 |
| JP | 2013-62001 | 4/2013 |

OTHER PUBLICATIONS

Written Opinion dated Nov. 11, 2014 in PCT/JP2014/072611 filed Aug. 28, 2014.

* cited by examiner

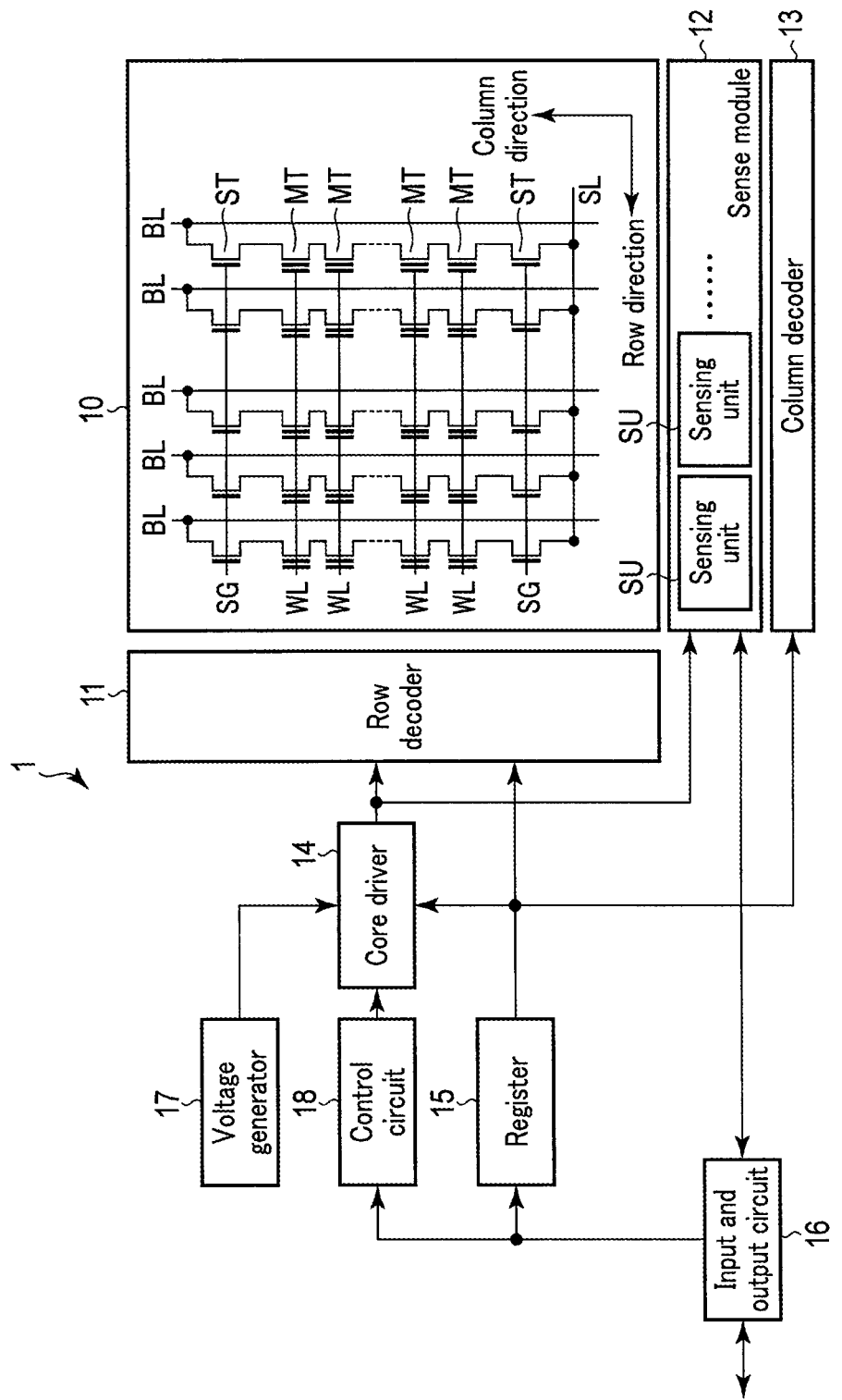
F I G. 1

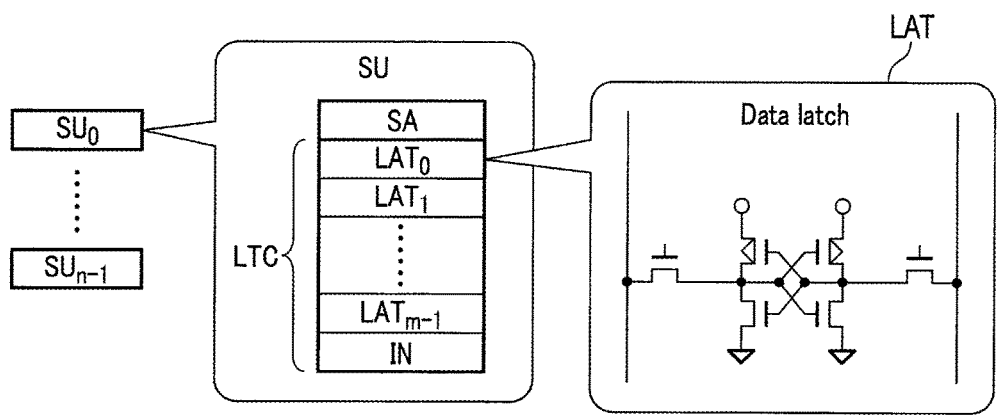
F I G. 2

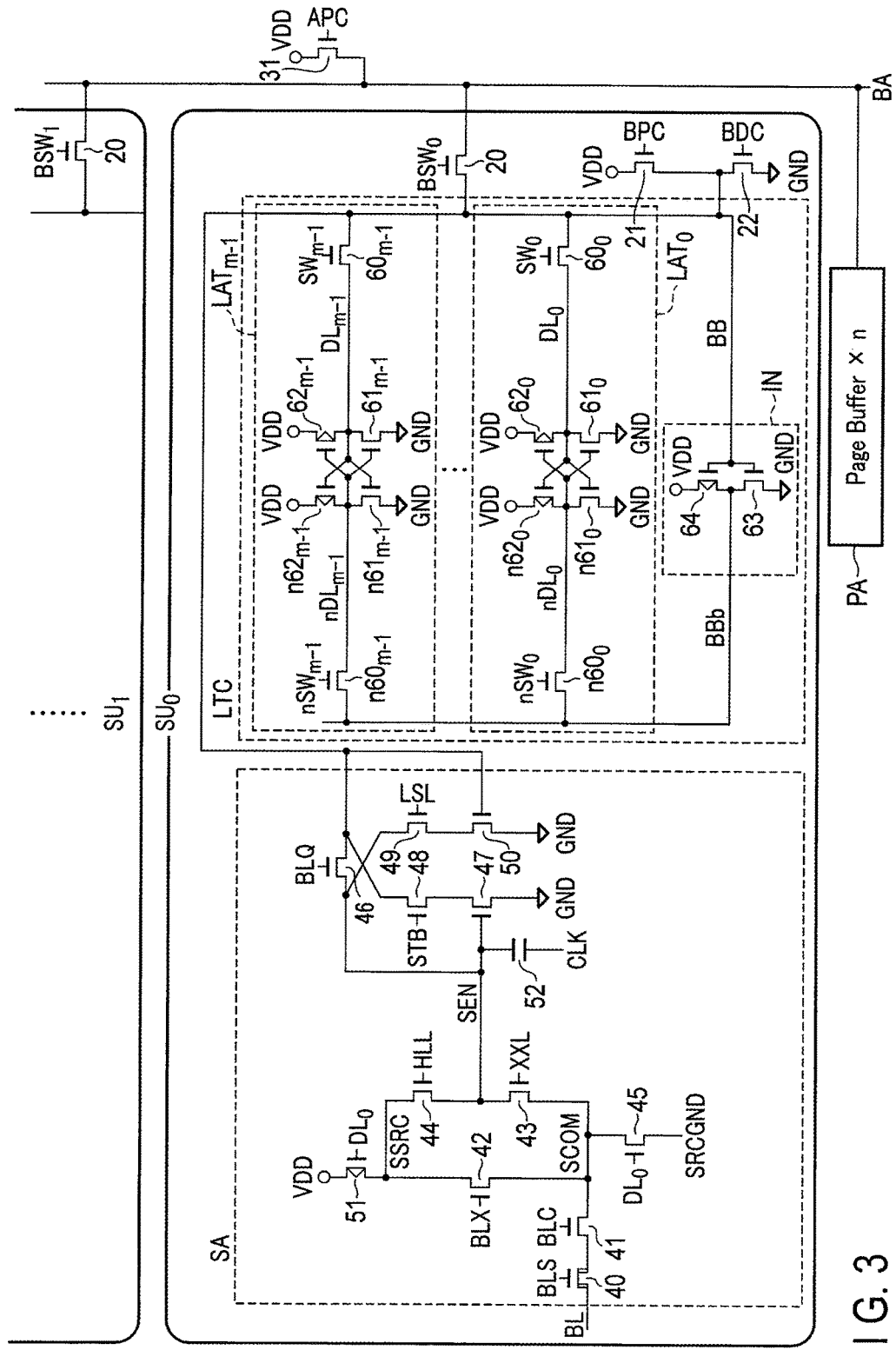
F I G. 3

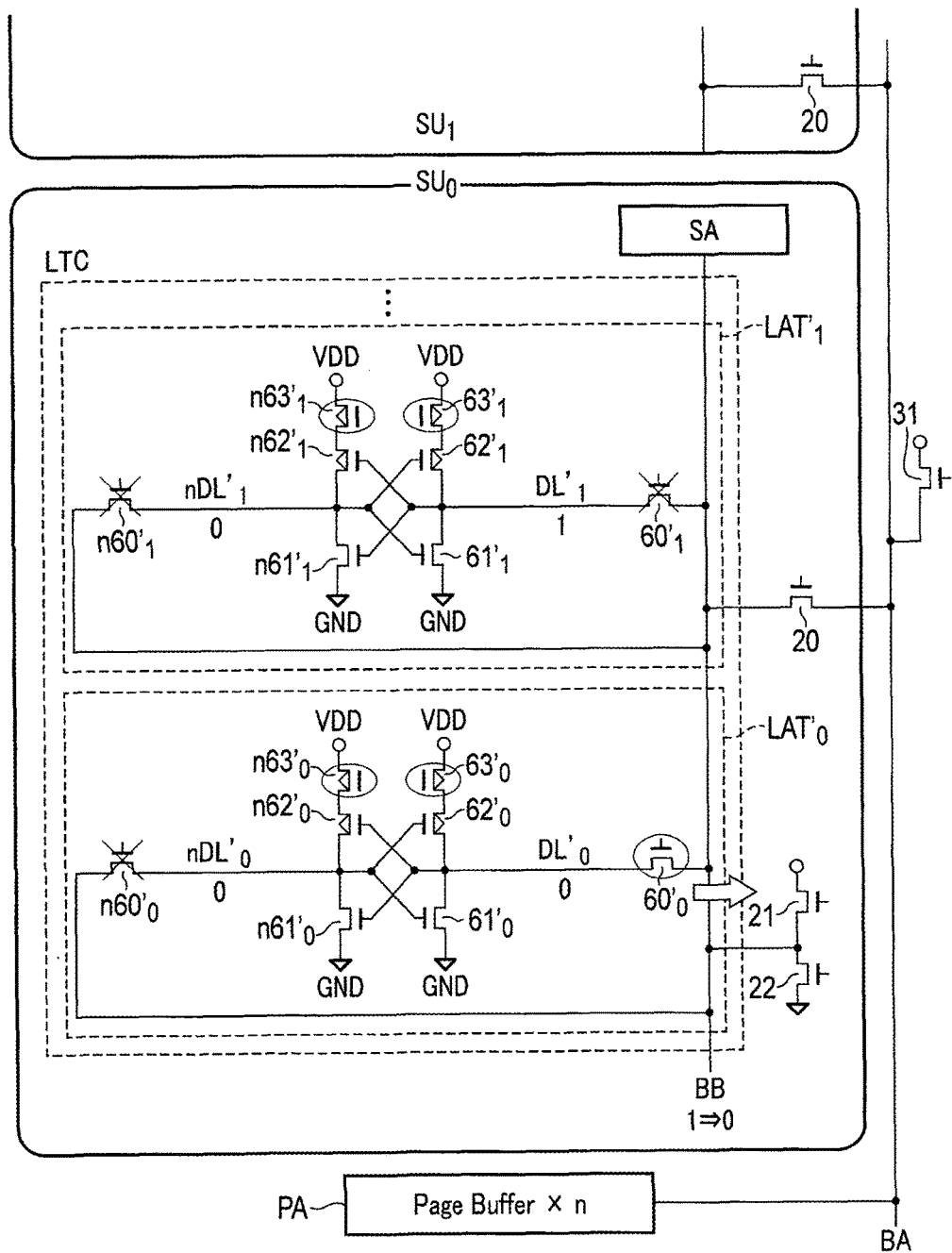
F I G. 4

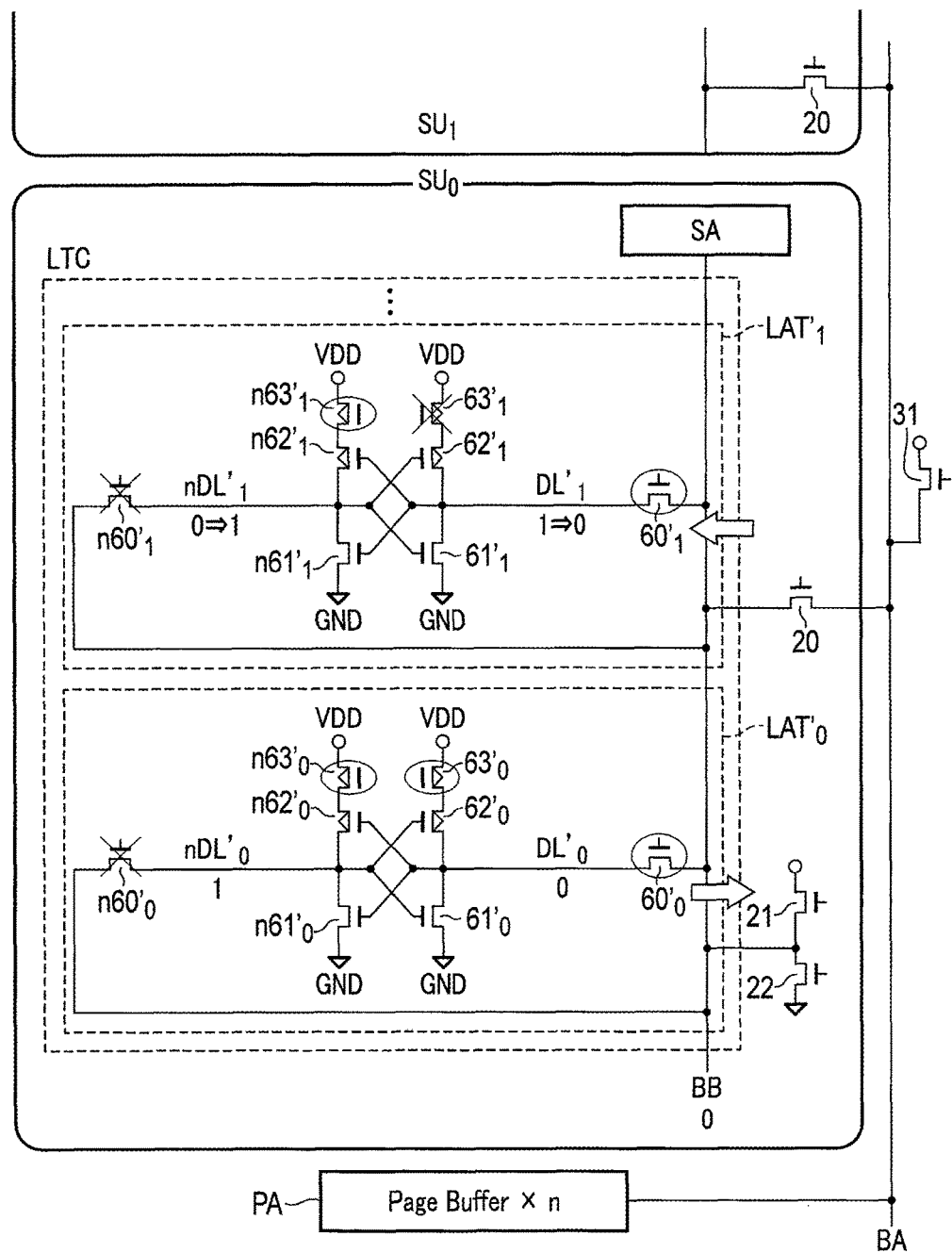
F I G. 5

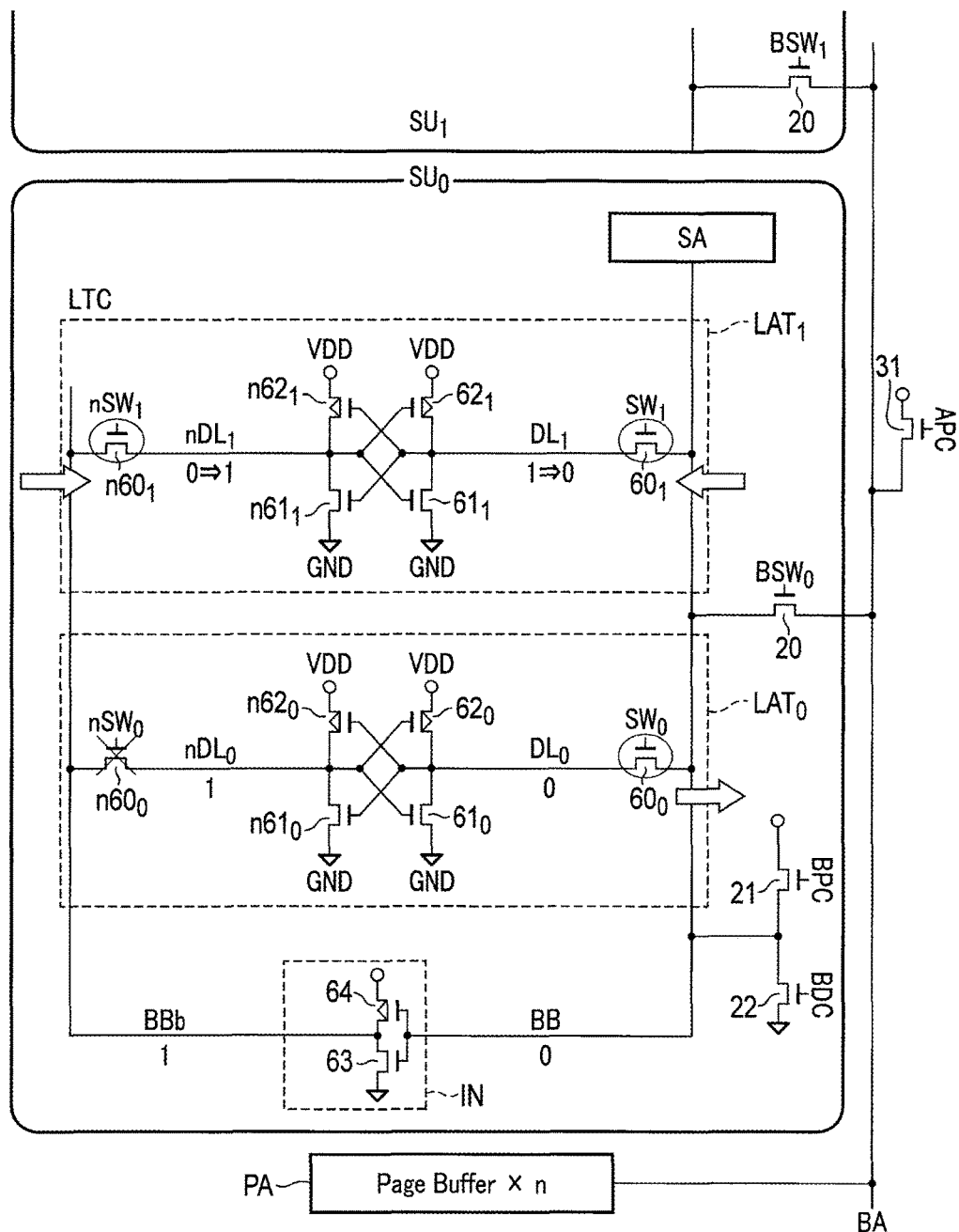
F I G. 9

SEMICONDUCTOR MEMORY DEVICE

CROSS-REFERENCE TO RELATED APPLICATIONS

This application is a Continuation application of PCT Application No. PCT/JP2014/072611, filed Aug. 28, 2014, the entire contents of which are incorporated herein by reference.

FIELD

Embodiments relate to a semiconductor memory device.

BACKGROUND

As a semiconductor memory device, NAND flash memories, etc. are known.

BRIEF DESCRIPTION OF THE DRAWINGS

FIG. 1 illustrates an example of a block configuration of a semiconductor memory device according to one embodiment;

FIG. 2 illustrates an example of a basic configuration of a sensing module according to one embodiment;

FIG. 3 illustrates an example of a circuit configuration of a sensing unit according to one embodiment;

FIG. 4 illustrates an operation in which data is output from a data latch of a comparative example;

FIG. 5 illustrates an operation in which data is input into a data latch of the comparative example;

FIG. 9 illustrates an operation in which data is input into the data latch of one embodiment.

DETAILED DESCRIPTION

Figure 6:
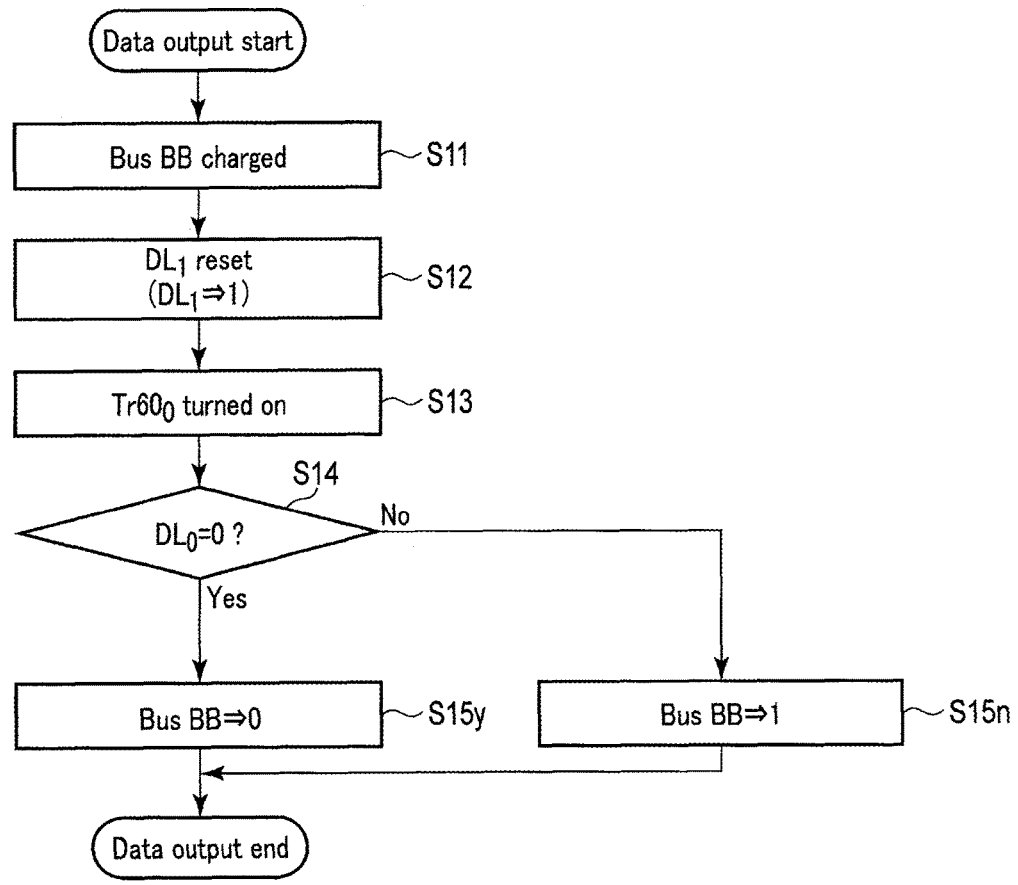
FIG. 6 illustrates the flow of an operation in which data is output from a data latch according to one embodiment.

In general, according to one embodiment, a semiconductor memory device includes a plurality of data latches; and an inverter shared by the plurality of data latches. The inverter is inserted between complementary buses that sandwich the plurality of data latches.

A semiconductor memory device, such as a NAND flash memory, includes data latches, for example. The data latches temporarily store data related to memory cells. Each data latch is provided with transistors to secure a margin of an operation of that data latch, for example.

A plurality of data latches are provided in a semiconductor memory device, and have a significant influence on the chip area.

Such embodiments are described in the following with reference to figures. In the figures, identical components are labeled with the same reference number. Moreover, duplicate descriptions are given as needed.

One Embodiment

A semiconductor memory device according to the present embodiment is described in the following. The semiconductor memory device according to the present embodiment is a NAND flash memory, for example.

(1) Example of Configuration of Semiconductor Memory Device

An example of a configuration of a NAND flash memory 1 as a semiconductor memory device according to the present embodiment is described using FIG. 1. FIG. 1 illustrates an example of a block configuration of the semiconductor memory device according to the present embodiment.

As illustrated in FIG. 1, the NAND flash memory 1 includes a memory cell array 10, a row decoder 11, a sensing module 12, a column decoder 13, a core driver 14, a register 15, an input and output circuit 16, a voltage generator 17, and a controller 18. The NAND flash memory 1 includes at least one or more sets of the memory cell array 10 and the sensing module 12. NAND flash memory 1 may include a plurality of these sets.

The memory cell array 10 includes a plurality of bit lines BL, a source line SL, and a plurality of word lines WL that perpendicularly intersect with the bit lines BL. The bit lines BL extend in a column direction, and the word lines WL extend in a row direction. Between each bit line BL and the source line SL, a plurality of NAND strings lined up in the row direction are coupled. Each NAND string includes serially-coupled memory cell transistors MT and a set of select transistors ST serially-coupled to both ends thereof. A NAND string is coupled to a bit line BL and the source line SL through the select transistors ST at both ends. Each word line WL is coupled to gates of memory cell transistors MT lined up in the row direction. A select gate line SG is coupled to the gates of select transistors ST lined up in the row direction. Thus, in the memory cell array 10, a plurality of memory cell transistors MT are arranged in a matrix in a plane. In the NAND flash memory 1, the memory cell transistors MT serve as memory cells.

A memory cell transistor MT includes a stacked structure of a control gate electrode and a floating gate electrode, for example. In such a stacked structure, electric charges are injected into the floating gate electrode. A memory cell transistor MT may have its threshold varied by the amount of injected electric charge, and stores binary or multi-level data. The memory cell transistors MT may include a MONOS (Metal-Oxide-Nitride-Oxide-Silicon) structure, instead of the above-mentioned stacked structure. In the MONOS structure, electrons are trapped in a nitride film.

The row decoder 11 selects memory cell transistors MT in the row direction. Specifically, the row decoder 11 selects one of the word lines WL during data writes and reads. Moreover, the row decoder 11 applies required voltages to a selected word line WL and unselected word lines WL.

The sensing module 12 includes sensing units SU. A plurality of sensing units SU are correspondingly provided to the bit lines BL. The sensing units SU perform sensing and amplification of data read to the bit lines BL during data reads. The sensing units SU transfer write data to the bit lines BL during data writes.

The column decoder 13 selects memory cell transistors MT in the column direction. Specifically, the column decoder 13 selects one of the sensing units SU during a transfer of write data and read data.

The voltage generator 17 generates voltages required for data writes, reads, and erasures in response to commands of the controller 18. The voltage generator 17 supplies the generated voltages to the core driver 14.

The core driver 14 supplies required voltages of the voltage supplied from the voltage generator 17 to the row decoder 11 and the sensing module 12 in response to, for example, commands of the controller 18. The voltages supplied from the core driver 14 are transferred to the word lines WL by the row decoder 11, and are applied to the bit lines BL by the sensing module 12.

The input and output circuit 16 controls input and output of signals with a controller or host apparatus that accesses the NAND flash memory 1.

The register 15 stores commands, addresses, etc. received from the controller or host apparatus. Moreover, the register 15 transfers row addresses to the row decoder 11 and the core driver 14, and transfers column addresses to the column decoder 13, for example.

The controller 18 controls all operations of the NAND flash memory 1 in accordance with commands received from the memory controller or host apparatus. Various control signals in the following description are generated by the controller 18, for example.

(2) Example of Configuration of Sensing Module

An example of configuration of the sensing module 12 of the NAND flash memory 1 is described using FIGS. 2 and 3.

[Basic Configuration of Sensing Module]

FIG. 2 illustrates an example of a basic configuration of the sensing module according to the present embodiment.

As illustrated in FIG. 2, the sensing module 12 includes a plurality of sensing units SU ($SU_0$, $SU_1$, ... $SU_{n-1}$), each of which is provided for each bit line BL. A sensing unit SU includes a sensing circuit SA and a latch circuit LTC. The latch circuit LTC includes a plurality of data latches LAT ($LAT_0$, $LAT_1$, ... $LAT_{m-1}$) and an inverter IN shared by the data latches LAT. That is, one sensing circuit SA is provided for every sensing unit SU. Moreover, the plurality of data latches LAT and one inverter IN are provided for every sensing circuit SA. Specifically, the sensing module 12 includes sixteen (n=16) sensing units SU, for example. A sensing unit SU includes five (m=5) data latches LAT, for example.

The sensing circuits SA perform sensing and amplification of data read to the bit lines BL. The data latches LAT temporarily store read data from the bit lines BL, and write data to the bit lines BL.

[Configuration of Sensing Unit]

FIG. 3 illustrates an example of the circuit configuration of a sensing unit according to the present embodiment.

As illustrated in FIG. 3, components are coupled by buses BA and BB inside and outside the sensing unit SU. The bus BB is an internal bus provided in the sensing unit SU, and the bus BA is a bus that couples sensing units SU ($SU_0$, $SU_1$, ... $SU_{n-1}$).

Within the sensing unit SU, a sensing circuit SA and a plurality of data latches LAT are coupled to the bus BB. The sensing circuit SA and the data latches LAT transmit and receive data through the bus BB. The data latches LAT are also coupled to a bus BBb. The bus BBb is arranged through the inverter IN at the opposite side of the bus BB, and is a bus complementary to the bus BB. The data latches LAT are inserted between the complementary buses BB and BBb.

The plurality of sensing units SU is coupled to the bus BA. The bus BA is coupled to the same number of page buffers PA as the sensing units SU. That is, n sensing circuits SA and n page buffers PA share one bus BA. A page buffer PA temporarily stores read data and write data in a data unit called "a page." The sensing units SU and page buffers PA transmit and receive data through the bus BA. Moreover, the sensing units SU and the input and output circuit 16 of FIG. 1 transmit and receive data through the bus BA.

The buses BB and the bus BA are coupled through transistors 20. The bus BB is also coupled with transistors 21 and 22. The bus BA is coupled with a transistor 31. The transistors 20, 22, and 31 are made, for example, as low-withstand-voltage n-channel MOS (Metal Oxide Semiconductor) transistors.

The transistors 20 couple the sensing units SU to the bus BA. The gates of transistors 20 are supplied with control signals BSW. Different control signals BSW ($BSW_0$, $BSW_1$, ... $BSW_{n-1}$) are provided for respective sensing units SU ($SU_0$, $SU_1$, ... $SU_{n-1}$) so that one sensing unit SU is coupled to the bus BA. Thus, the transistors 20 serve as bus switch circuits.

The transistor 21 is coupled to a power voltage (VDD) at one end of the current path and coupled to the bus BB at the other end thereof, and receives a control signal BPC at the gate. The transistor 22 is coupled to a ground potential (GND, for example, 0V) at one end of the current path and coupled to the bus BB at the other end thereof, and receives a control signal BDC at the gate. The transistors 21 and 22 respectively serve as a pre-charge circuit to charge the bus BB, and a discharge circuit to discharge the bus BB.

A transistor 31 is coupled to the power voltage (VDD) at one end of the current path and coupled to the bus BA at the other end, and receives a control signal APC at the gate. The transistor 31 serves as a pre-charge circuit to charge the bus BA.

(Sensing circuit)

The sensing circuit SA includes transistors 40-51 and a capacitor element 52. The transistor 40 is made, for example, as a high-withstand-voltage $n$-channel MOS transistor. The transistors 41-50 are made, for example, as low-withstand-voltage $n$-channel MOS transistors. The transistor 51 is made, for example, as a low-withstand-voltage p-channel MOS transistor.

The transistor 40 is coupled to a corresponding bit line BL at one end of the current path and coupled, at the other end thereof, to one end of the current path of the transistor 41, and receives a control signal BLS at the gate. The transistor 41 is coupled to a node SCOM at the other end of the current path, and receives a control signal BLC at the gate. The transistor 41 clamps the corresponding bit line BL to a potential according to the control signal BLC.

The transistors 42-45 and 51 serve as a bit line controller. The bit line controller controls the potential of the bit line BL and senses data.

The transistor 51 is coupled to the power voltage (VDD) at one end of the current path and coupled to a node SSRC at the other end thereof, and is coupled to a node $DL_0$ at the gate. The transistor 42 is coupled to the node SSRC at one end of the current path and coupled to the node SCOM at the other end thereof, and receives a control signal BLX at the gate. The transistor 44 is coupled to the node SSRC at one end of the current path and coupled to a node SEN at the other end thereof, and receives a control signal HLL at the gate. The transistor 43 is coupled to the node SEN at one end of the current path and coupled to the node SCOM at the other end thereof, and receives a control signal XXL at the gate. The transistor 45 is coupled to the node SCOM at one end of the current path and coupled to a node SRCGND (for example, 0V) at the other end thereof, and is coupled to the node $DL_0$ at the gate.

The capacitor element 52 is coupled to the node SEN at one electrode, and receives a clock CLK at the other electrode.

The transistors 46-50 serve as a strobe circuit. The strobe circuit transfers read data to the latch circuit LTC through the bus BB.

The transistor 46 is coupled to the node SEN at one end of the current path and coupled to the bus BB at the other end thereof, and receives a control signal BLQ at the gate. The transistor 48 is coupled to the bus BB at one end of the current path and coupled, at the other end thereof, to one end of the current path of the transistor 47, and receives a control signal STB at the gate. The transistor 47 is coupled to the ground potential (GND) at the other end of the current path, and coupled to the node SEN at the gate. The transistor 49 is coupled to the node SEN at one end of the current path and coupled, at the other end thereof, to one end of the current path of the transistor 50, and receives a control signal LSL at the gate. The transistor 50 is coupled to the ground potential (GND) at the other end of the current path, and coupled to the bus BB at the gate.

(Latch Circuit)

The latch circuit LTC includes transistors 60 ($60_0$, $60_1$, ... $60_{m-1}$) to 62 ($62_0$, $62_1$, ... $62_{m-1}$), transistors n60 ($n60_0$, $n60_1$, ... $n60_{m-1}$) to n62 ($n62_0$, $n62_1$, ... $n62_{m-1}$), and transistors 63 and 64. The transistors $60_0$, $n60_0$, $61_0$, $n61_0$, $62_0$, and $n62_0$ are included in the data latch $LAT_0$. The transistors $60_1$, $n60_1$, $61_1$, $n61_1$, $62_1$, and $n62_1$ are included in the data latch $LAT_1$. Similarly, transistors $60_{m-1}$, $n61_{m-1}$, $62_{m-1}$, and $n62_{m-1}$ are included in the data latch $LAT_{m-1}$. The transistors 63 and 64 are included in the inverter IN. These transistors 60, n60, 61, n61, and 63 are made, for example, as low-withstand-voltage n-channel MOS transistors. The transistors 62, n62, and 64 are made, for example, as low-withstand-voltage p-channel MOS transistors.

In each of the data latches LAT ($LAT_0$, $LAT_1$, ... $LAT_{m-1}$), the transistor 60 as a first transfer transistor couples the end of that data latch LAT to the bus BB. The transistor n60 as a second transfer transistor couples the other end of that data latch LAT to the bus BBb.

More specifically, the transistor 60 is coupled to the bus BB at one end of the current path and coupled to the node DL ($DL_0$, $DL_1$, ... $DL_{m-1}$) as a first node at the other end thereof, and receives a control signal SW ($SW_0$, $SW_1$, ... $SW_{m-1}$) at the gate. The transistor n60 is coupled to the bus BBb at one end of the current path and coupled to the node nDL ($nDL_0$, $nDL_1$, ... $nDL_{m-1}$) as a second node at the other end thereof, and receives a control signal nSW ($nSW_0$, $nSW_1$, ... $nSW_{m-1}$) at the gate.

Each data latch LAT includes a first inverter including transistors 61 and 62 and a second inverter including transistors n61 and n62. Moreover, the inputs and outputs of the first and second inverters are cross-coupled to each other, and thereby a flip-flop is made.

More specifically, the transistor 62 is coupled to the power voltage (VDD) at one end of the current path, coupled to the node DL at the other end thereof, and coupled to the node nDL at the gate.

The transistor 61 is coupled to the node DL at one end of the current path, coupled to the ground potential (GND) at the other end thereof, and coupled to the node nDL at the gate. The transistor n62 is coupled to the power voltage (VDD) at one end of the current path, coupled to the node nDL at the other end thereof, and coupled to the node DL at the gate. The transistor n61 is coupled to the node nDL at one end of the current path, coupled to the ground potential (GND) at the other end thereof, and coupled to the node DL at the gate. Thus, the output of the first inverter and the input of the second inverter, i.e., the node DL, are coupled to the bus BB through the transistor 60 for data transmission. Moreover, the input of the first inverter and the output of the second inverter, i.e., the node nDL, are coupled to the bus BBb through the transistor n60 for data transmission.

By the above, each data latch LAT stores data at the node DL, and stores complementary data (inverted data) at the node nDL.

The inverter IN includes a configuration of an inverter including the transistors 63 and 64. Specifically, the inverter IN is made as a CMOS (Complementary Metal-Oxide Semiconductor) inverter including an n-channel MOS transistor (transistor 63) and a p-channel MOS transistor (transistor 64).

More specifically, the transistor 64 is coupled to the power voltage (VDD) at one end of the current path, coupled to the bus BBb at the other end thereof, and coupled to the bus BB at the gate. The transistor 63 is coupled to the bus BBb at one end of the current path, coupled to the ground potential (GND) at the other end thereof, and coupled to the bus BB at the gate.

By the above, the buses BB and BBb at both sides of the inverter IN are in a complementary relationship. For example, when "0" data is stored on the bus BB, "1" data complementary to the "0" data is stored on the bus BBb.

(3) Example of Operation of Sensing Module

An example of operation of the sensing module 12 of the NAND flash memory 1 is described using FIGS. 4 to 9.

The following is a description of an operation in which data is transferred from one data latch LAT to another data latch LAT of the sensing module 12. That is, in this operation, data is output from one data latch LAT to the bus BB, and this output data is input into another data latch LAT. This operation is described while being compared with a comparative example of an operation of a sensing module.

In the following, an "H" level potential, voltage, or signal (for example, VDD) indicates "1" data, and an "L" level potential, voltage, or signal (for example, GND) indicates "0" data. Moreover, in the following FIGS. 4, 5, 7, and 9, among the main transistors subject to operation, those that are ON are labeled with an "0" mark and those that are OFF are labeled with an "X" mark.

[Example of Operation of Sensing Module of Comparative Example]

FIG. 4 illustrates an operation in which data is output from a data latch of the comparative example. FIG. 5 illustrates an operation in which data is input into a data latch of the comparative example. As illustrated in FIG. 4, a data latch LAT' of the comparative example includes transistors 60', n60', 61', n61', 62', n62', 63', and n63'. The transistors 60' and n60' couple respective ends of the data latch LAT' to the bus BB. A first inverter is made of the transistors 61' and 62', and a second inverter is made of the transistor n61' and n62'. Inputs and outputs of the first and second inverters are cross-coupled to each other, and thereby a flip-flop is made. Here, one end of each of the first and second inverters, i.e., one end of the current path of each of the transistors 62' and n62', is respectively coupled to the power voltage (VDD) through the transistors 63' and n63'. The transistors 63' and n63' serve as control transistors that suppress penetration currents from flowing into the first and second inverters.

For example, "0" data is transferred from a data latch $LAT'_0$ to a data latch $LAT'_1$. The destination data latch $LAT'_1$ has been reset and "1" data is stored on the node $DL'_1$. In this state, the transistors $63'_0$ and $n63'_0$ of the data latch $LAT'_0$ and the transistors $63'_1$ and $n63'_1$ of the data latch $LAT'_1$ are ON.

First, the transistor 21 is turned on, the bus BB is pre-charged, and "1" data is stored on the bus BB.

Subsequently, the transistor $60'_0$ of the data latch $LAT'_0$ is turned on, and "0" data is output from the node $DL'_0$ of the data latch $LAT'_0$ to the bus BB.

As illustrated in FIG. 5, the transistor $60'_1$ of the data latch $LAT'_1$ is then turned on. With this, "0" data output from the data latch $LAT'_0$ is input into the node $DL'_1$ of the data latch $LAT'_1$. During this, the transistor $63'_1$ is turned off and a penetration current is suppressed from flowing from the power voltage (VDD) through the transistors $63'_1$, $62'_1$, and $61'_1$ into the ground potential (GND). Furthermore, the penetration current is suppressed from flowing from the power voltage (VDD) through the transistors $63'_1$ and $62'_1$, the bus BB and the transistor $60'_0$, and the transistor $61'_0$ to the ground potential (GND). "0" data on the node DL' causes the node nDL' to store "1" data through the second inverter. The transistor $n60'_1$ remains off.

[Example of Operation of Sensing Module of Present Embodiment]

Figure 7:
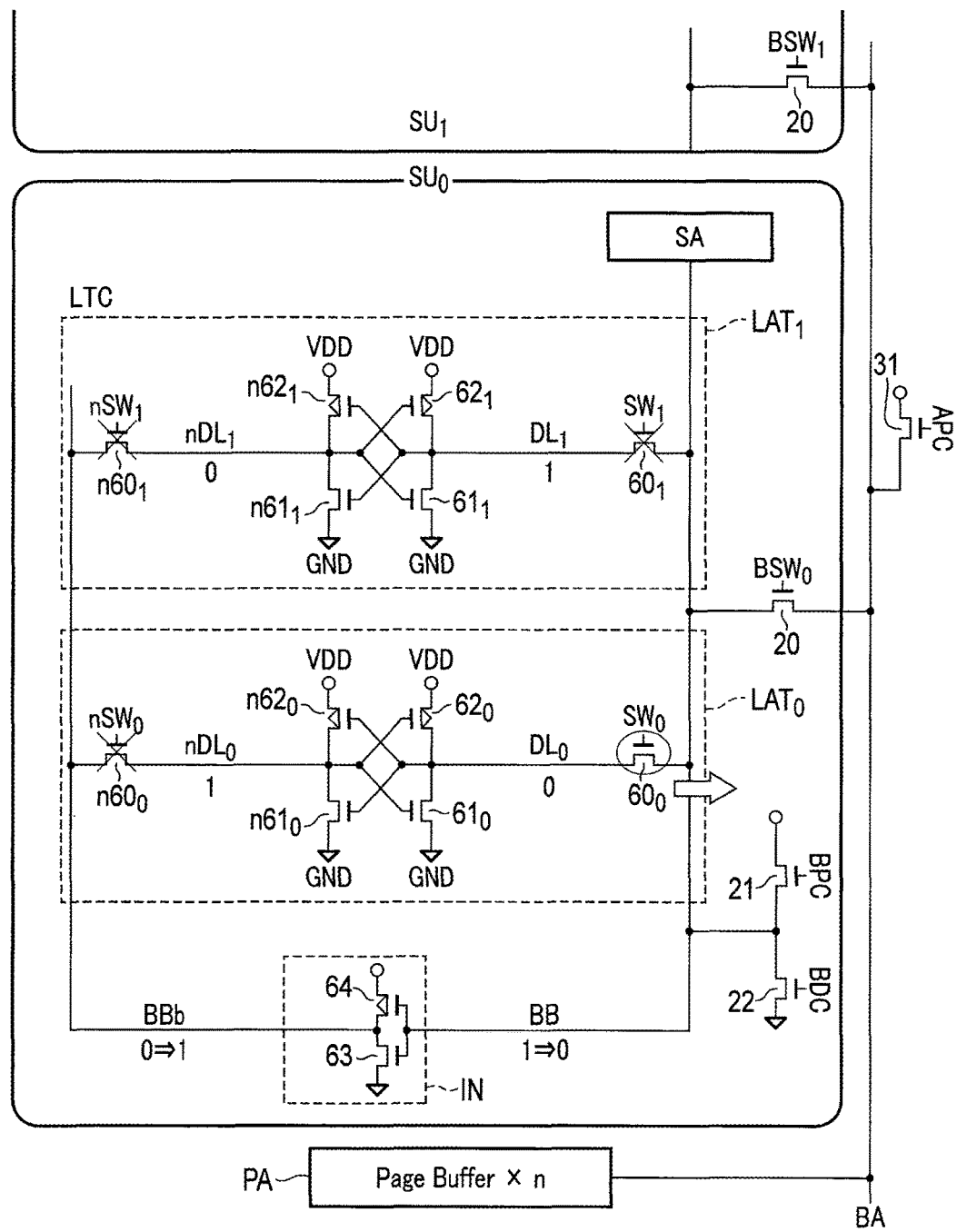
FIG. 7 illustrates an operation in which data is output from a data latch of one embodiment.
Figure 8:
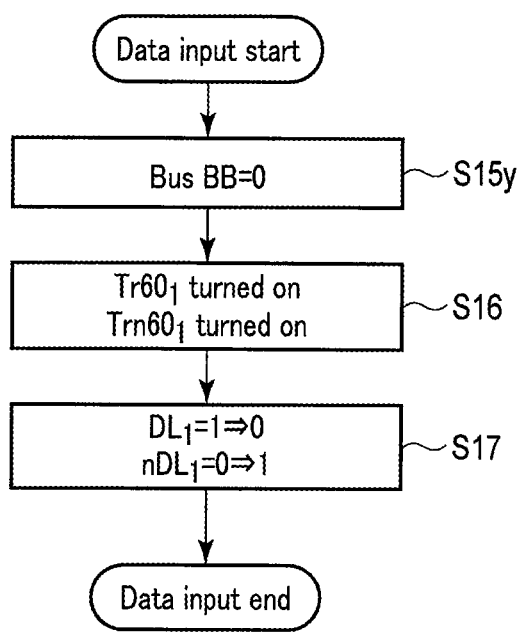
FIG. 8 illustrates the flow of an operation in which data is input into the data latch of one embodiment.

FIG. 6 illustrates the flow of an operation in which data is output from a data latch according to the present embodiment. FIG. 7 illustrates an operation in which data is output from a data latch of the present embodiment. FIG. 8 illustrates the flow of an operation in which data is input into a data latch of the present embodiment. FIG. 9 illustrates an operation in which data is input into a data latch of the present embodiment.

The following is a description of a case in which "0" data is transferred from, for example, the data latch $LAT_0$ to the data latch $LAT_1$.

As illustrated in FIGS. 6 and 7, the bus BB is charged by pre-charging (S11). Specifically, the "H" level control signal BPC is applied to the transistor 21, and the transistor 21 is turned on. With this, the bus BB is charged, and "1" data is stored on the bus BB. On the bus BBb, "0" data complementary to "1" data of the bus BB is stored.

Subsequently, the data latch $LAT_1$ is reset and "1" data is stored on the node $DL_1$ (S12). Specifically, the transistors $60_1$ and $n60_1$ are turned on with the bus BB pre-charged as described above. Once the node $DL_1$ is charged, the transistor $60_1$ and $n60_1$ are turned off.

With the above operation, "1" data is stored on the node $DL_1$ and "0" data complementary to "1" data of the node $DL_1$ is stored on the node $nDL_1$. With this, the "L" level voltage is applied to the respective gates of the transistors $61_1$ and $62_1$ of the first inverter. Therefore, the transistor $61_1$ is turned off and the transistor $62_1$ is turned on. Moreover, the "H" level voltage is applied to the respective gates of the transistors $n61_1$ and $n62_1$ of the second inverter. Therefore, the transistor $n61_1$ is turned on, and the transistor $n62_1$ is turned off.

Subsequently, the "H" level control signal $SW_0$ is applied to the transistor $60_0$ of the data latch $LAT_0$, and the transistor $60_0$ is turned on (S13). During this, the transistor $n60_0$ remains off.

The flow of operation branches according to the data that the node $DL_0$ stores (S14). In this description, the data that the node $DL_0$ stores is "0". Therefore, "0" data of the node $DL_0$ is output to the bus BB (S15y). When the data that the node $DL_0$ stores is "1", "1" data of the node $DL_0$ is output to the bus BB (S15n).

In the above S15y, even when the transistor $60_0$ of the data latch $LAT_0$ is turned on, "0" data that the node $DL_0$ stores is not immediately transferred to the bus BB. This is because the length of the bus BB is long compared with the node $DL_0$, and the capacity of the bus BB is large compared with the node $DL_0$. For this reason, the potential of the bus BB temporarily rises. Therefore, the following flow is performed after the values on the buses BBb and BB turn into the values of the data that the data latch LAT( ) stores.

As illustrated in FIGS. 8 and 9, the "H" level control signals $SW_1$ and $nSW_1$ are respectively given to the transistors $60_1$ and $n60_1$ of the data latch $LAT_1$, and the transistors $60_1$ and $n60_1$ are turned on (S16). With this, "0" data output from the data latch $LAT_0$ is input into the node $DL_1$ of the data latch $LAT_1$ through the bus BB. Data "1" complementary to "0" data of the node $DL_1$ is input into the node $nDL_1$ through the bus BBb (S17).

Even when in this state the transistors $60_1$ and $n60_1$ of the data latch $LAT_1$ are turned on, the data of the nodes $DL_1$ and $nDL_1$ of the data latch $LAT_1$ do not switch into "0" or "1" data immediately. Furthermore, the potentials of the nodes $DL_1$ and $nDL_1$ of the data latch $LAT_1$ are pushed by the potentials of the buses BB and BBb that have complementary data from both sides, and temporarily turn into an intermediate potential.

The intermediate potential that the node $DL_1$ has is a potential lower than the power voltage (VDD), and, for example, is a potential of a magnitude that cannot keep the transistor $n61_1$ completely on and does not completely turn off the same. That is, the intermediate potential that the node $DL_1$ has is a potential in between the potential to completely turn on the transistor $n61_1$ and the potential to completely turn off the same. With this, the current drivability of the transistor $n61_1$ decreases. Therefore, penetration current is kept from flowing from the power voltage (VDD) through the transistors $n62_1$ and $n61_1$ into the ground potential (GND). Furthermore, penetration current is kept from flowing from the power voltage (VDD) through the transistors 64, the bus BBb, and the transistors $n60_1$ and $n61_1$ into the ground potential (GND). Specifically, the transistor $n61_1$ serves as a control transistor.

The intermediate potential that the node $nDL_1$ has is a potential higher than the ground potential (GND), and is, for example, a potential of a magnitude that cannot keep the transistor $62_1$ completely on and does not completely turn off the same. That is, the intermediate potential that the node $nDL_1$ has is a potential in between the potential to completely turn on the transistor $62_1$ and the potential to completely turn off the same. With this, the current drivability of the transistor $62_1$ decreases. Therefore, penetration current is kept from flowing from the power voltage (VDD) through the transistors $62_1$ and $61_1$ into the ground potential (GND). Furthermore, penetration current is kept from flowing from the power voltage (VDD) through the transistor $62_1$, the bus BB, and the transistor $60_0$ into the ground potential (GND). Specifically, the transistor $62_1$ serves as a control transistor.

The potential of the node $DL_1$ goes to the potential of "0" data through the intermediate potential due to the potential of "0" data input from the bus BB. The potential of the node $DL_1$ gradually turns off the transistor $n61_1$, and gradually turns on the transistor $n62_1$. With this, the potential of the node $nDL_1$ goes to the potential of "1" data.

The potential of the node $nDL_1$ goes to the potential of "1" data through the intermediate potential also due to the potential of "1" data input from the bus BBb. The potential of the node $nDL_1$ gradually turns on the transistor $61_1$, and gradually turns off the transistor $62_1$. With this, the potential of the node $DL_1$ further goes to the potential of "0" data.

Thus, with the data output from the data latch $LAT_0$ to the buses BB and BBb, the potentials of the nodes $DL_1$ and $nDL_1$ start to change, respectively. The potentials of the nodes $DL_1$ and $nDL_1$ that have started to change further facilitate the respective change of the potentials of nodes $DL_1$ and $nDL_1$. After a particular period lapses, the potentials of the nodes $DL_1$ and $nDL_1$ respectively transition to the potential of "0" and the potential of "1" data, and the transitioned states are fixed.

As described, "0" data on the node $DL_0$ of the data latch $LAT_0$ is transferred to the node $DL_1$ of the data latch $LAT_1$, and is stored.

Note that when "0" data is stored on the node $DL_1$ of the data latch $LAT_1$ and "1" data is input into the node $DL_1$, ON and OFF of each of the transistors 61, n61, 62, and n62 are reversed.

Specifically, when "0" data is stored on the node $DL_1$, the transistors 61 and n62 are ON and the transistors n61 and 62 are OFF. For a case where the node $DL_1$ changes from "0" data to "1" data, when the nodes $DL_1$ and $nDL_1$ are temporarily of the intermediate potential, the current drivabilities of the transistors 61 and n62 decrease and suppress penetration current. Specifically, the transistors 61 and n62 serve as control transistors in this case.

Thus, in accordance with the data that the node $DL_1$ stores at first, all transistors 61, n61, 62, and n62 can serve as control transistors. That is, the transistors that are ON at first serve as control transistors when data changes.

(4) Advantages According to Present Embodiment

According to the present embodiment, one or more of the following advantages can be obtained.

(A) According to the present embodiment, the NAND flash memory 1 includes a plurality of data latches LAT and the inverter IN shared by the data latches LAT. The inverter IN is inserted between the complementary buses BB and BBb that sandwich the data latches LAT. This can reduce the count of the transistors of the data latches LAT while the margin of the operation of the data latches LAT is secured.

For example, data latches LAT' of the above-mentioned comparative example include control transistors, i.e., the transistors 63' and n63'. The control transistors are turned off when data is input to a data latch LAT' to suppress penetration current from flowing through the first and second inverters of that data latch LAT'. They also suppress penetration current from flowing between two first and second inverters of the data latches $LAT'_0$ and $LAT'_1$ via the bus BB.

According to the present embodiment, when data is input to a data latch LAT, the current drivability of one of the transistors 62 and 61 included in the first inverter of that data latch LAT and the current drivability of one of the transistors n62 and n61 included in the second inverter decrease to suppress penetration current. That is, these transistors serve as control transistors. Therefore, penetration current can be suppressed from flowing through the first and second inverters, and the operation margins of the data latches LAT can be obtained.

Moreover, according to the present embodiment, one of the transistors 62 and 61 included in the first inverter and one of the transistors n62 and n61 included in the second inverter of the data latches LAT serve as control transistors. For this reason, the operation margin of the data latches LAT can be obtained without providing a separate control transistor, and the count of transistors of the data latches LAT can be reduced. Therefore, the area of the data latches LAT can be reduced.

(B) According to the present embodiment, the NAND flash memory 1 obtains the operation margins of the data latches LAT through the inverter IN shared by the data latches LAT and complementary buses BB and BBb that sandwich the data latches LAT.

If a control transistor is simply eliminated in data latches LAT' of the comparative example, improving the operation margins of the data latches LAT' requires increasing the channel lengths L of the transistors 61', n61', 62', and n62', for example. This increases the threshold voltages (absolute values) of the transistors 61', n61', 62', and n62', which causes the current drivabilities to easily decrease due to a drop in the potentials (absolute values) of the nodes DL' and nDL'. However, this may make it difficult to reduce the sizes of the transistors 61', n61', 62', and n62' or match the sizes of the transistors 61', n61', 62', and n62'.

According to the present embodiment, the data latches LAT are sandwiched by the complementary buses BB and BBb to allow the transistors 61, n61, 62, and n62 of the first and second inverters to serve as control transistors. For this reason, a sufficient operation margin can be secured in the data latches LAT even with minimum dimensions of the channel lengths L of the transistors 61, n61, 62, and n62, for example. Therefore, the area of the data latches LAT can be further reduced.

Moreover, according to the present embodiment, the sizes of the transistor 61, n61, 62, and n62 are not applied with restrictions at least for securing the operation margin. This allows for a relatively free selection of the sizes of the transistors 61, n61, 62, and n62, and, for example, all transistors 61, n61, 62, and n62 can have the same size. Therefore, designing and manufacturing circuits is easy.

Moreover, according to the present embodiment, reducing the channel widths W of the transistors 61, n61, 62, and n62 causes the current drivabilities of the transistors 61, n61, 62, and n62 to easily decrease due to the decrease of the potentials (absolute values) of the nodes DL and nDL. Therefore, an increased operation margin in the data latches LAT can be obtained. The area of the data latches LAT is also further reduced.

(C) According to the present embodiment, a data latch LAT includes the two transistors 62 and 61 included in the first inverter, the two transistors n62 and n61 included in the second inverter, and the two transistors 60 and n60 coupling the complementary buses BB and BBb and that data latch LAT.

In contrast, a data latch LAT' of the comparative example includes not only the transistors 62' and 61' of the first inverter, the transistor n62' and n61' of the second inverter, and the transistors 60' and n60' that couple the bus BB and that data latch LAT', but the transistors 63' and n63' as control transistors. That is, the count of the transistors of a data latch LAT' is eight, for example.

According to the present embodiment, the count of the transistors of the data latch LAT can be reduced to six, for example.

(D) According to the present embodiment, the sensing module 12 includes $(6m+2) \times n$ transistors, where n is the count of the sensing circuits SA and m is the count of data latches included in a latch circuit LTC.

In contrast, assume that the comparative example includes the same number of sensing circuits and the data latches LAT' as the above number, $8m \times n$ transistors are included. As mentioned above, with $m=5$ and $n=16$, as many as total 640 transistors are included in the comparative example.

According to the present embodiment, the count of the transistors that the sensing module 12 includes is 512, for example. In such examples, the count of transistors of the present embodiment is reduced by 20% in comparison with the comparative example. Thus, according to the present embodiment, the count of the transistors can be reduced from, for example, the case of use of the data latches LAT' of the comparative example. Therefore, the chip area of the NAND flash memory 1 can be reduced. A plurality of data latches LAT are included in the NAND flash memory 1, and the influence that the data latches LAT pose on the chop area is significant.

(E) According to the present embodiment, both transistors 60 and n60 are turned on when data is input into a data latch LAT. The nodes DL and nDL have a potential between a potential with which turned-on transistors of the transistors 61 n61, 62, and n62 of the first and second inverters remain on and the potential with which the same turn off.

This decreases the current drivability of a turned-on transistor of the transistors 62 and 61 included in the first inverter and that of a turned-on transistor of the transistors n62 and n61 included in the second inverter of the data latch LAT, which suppresses penetration current.

Other Embodiments

The sensing module 12 has been described as including the sensing circuits SA illustrated in FIG. 3 as an example in the above-mentioned embodiments; however this is not the only case. The circuit configuration of the sensing circuits can be selected suitably. Moreover, the number of the sensing circuits and the data latches included in the sensing module, and the number of the data latches and inverters included in a latch circuit are discretionary. For example, two or more inverters may be included in a latch circuit. As long as the inverters are fewer than the data latches, the advantages of reducing the number of the transistors included in the data latches can be obtained.

An example where memory cells (memory cell transistors MT) are arranged in a plane in the memory cell array 10 has been described in the above embodiments; however this is not the only case. The semiconductor memory device of embodiments may be a NAND flash memory with memory cells arranged in two dimensions, or a NAND flash memory with memory cells stacked in three dimensions.

An example where the semiconductor memory device is a NAND flash memory in the above embodiments; however this is not the only case. The semiconductor memory device may not be a flash memory, but may be a DRAM (Dynamic Random Access Memory).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of data latches including respective first transfer transistors and respective second transfer transistors, the first transfer transistors including respective first nodes and respective first gate terminals, the first nodes being coupled to a first bus, the first gate terminals respectively receiving first signals, the second transfer transistors including respective second nodes and respective second gate terminals, the second nodes being coupled to a second bus, the second gate terminals respectively receiving second signals, the first bus being complementary to the second bus, the first signal and the second signal being independent in each of the data latches; and
an inverter including a third node and a fourth node, the third node being coupled to the first bus, the fourth node being coupled to the second bus.

2. The semiconductor memory device according to claim 1, further comprising:
a memory cell;
a sensing circuit that reads data of the memory cell; and
a latch circuit that can temporarily store data associated with the memory cell, the latch circuit including the plurality of data latches and the inverter.

3. The semiconductor memory device according to claim 2, wherein:
the semiconductor memory device includes (6m+2)×n transistors, where n is a count of sensing circuits and m is a count of the plurality of data latches included in the latch circuit.

4. The semiconductor memory device according to claim 1, wherein:
the plurality of data latches include respective fifth nodes and respective sixth nodes,
each of the data latches can store particular data on the fifth node of that data latch and data complementary to the particular data on the sixth node of that data latch,
the fifth nodes of the plurality of data latches are respectively coupled to the first transfer transistors, and
the sixth nodes of the plurality of data latches are respectively coupled to the second transfer transistors.

5. The semiconductor memory device according to claim 1, wherein:
each of the plurality of data latches includes a first inverter and a second inverter,
in each of the plurality of data latches, an input of the first inverter and an output of the second inverter are coupled, and an output of the first inverter and an input of the second inverter are coupled.

6. The semiconductor memory device according to claim 5, wherein:
the first inverter of each of the plurality of data latches includes a p-channel MOS transistor and an n-channel MOS transistor, and
the second inverter of each of the plurality of data latches includes a p-channel MOS transistor and an n-channel MOS transistor.

7. The semiconductor memory device according to claim 1, wherein:
each of the plurality of data latches further includes:
two transistors included in a first inverter; and
two transistors included in a second inverter.

8. The semiconductor memory device according to claim 1, wherein:
the inverter includes a p-channel MOS transistor and an n-channel MOS transistor.

9. The semiconductor memory device according to claim 1, wherein:
the inverter includes two transistors.

10. The semiconductor memory device according to claim 1, wherein:
either of the first transfer transistor and the second transfer transistor is turned on in one of the plurality of data latches when data is output from the one of the plurality of data latches.

11. The semiconductor memory device according to claim 1, wherein:
the first transfer transistor and the second transfer transistor are turned on in one of the plurality of data latches when data is input into the one of the plurality of data latches.

12. The semiconductor memory device of claim 11, wherein:
- each of the plurality of data latches includes a first inverter including a transistor and a second inverter including a transistor, and
- when in one of the plurality of data latches the first transfer transistor and the second transistor are turned on, the fifth node and the sixth node in the one of the plurality of data latches come to have a potential in between a potential with which turned-on transistors in one of the plurality of data latches remain on, and a potential with which the turned-on transistors turn off.

13. The semiconductor memory device according to claim 1, wherein:
- the semiconductor memory device is a NAND flash memory in which memory cells are arranged in two dimensions.

14. The semiconductor memory device according to claim 1, wherein:
- the semiconductor memory device is a NAND flash memory in which memory cells are stacked in three dimensions.

15. A semiconductor memory device comprising:
- a memory cell;
- a sensing circuit that reads data of the memory cell;
- a latch circuit that can store data associated with the memory cell temporarily, the latch circuit including a plurality of data latches and an inverter, the data latches including respective first nodes and respective second nodes, the first nodes being coupled to a first bus, the second nodes being coupled to a second bus, the first bus being complementary to the second bus, the inverter including a third node and a fourth node, the third node being coupled to the first bus, the fourth node being coupled to the second bus.

16. The semiconductor memory device according to claim 15, wherein:
- the plurality of data latches include respective fifth nodes and respective sixth nodes;
- each of the data latches can store particular data on the fifth node of that data latch and data complementary to the particular data on the sixth node of that data latch;
- each of the data latches includes a first transfer transistor coupled between the first node and the firth node of that data latch; and a second transfer transistor coupled between the second node and the sixth node of that data latch.

17. The semiconductor memory device according to claim 16, wherein:
- the first transfer transistor and the second transfer transistor are turned on in one of the plurality of data latches when data is input into the one of the plurality of data latches.

18. The semiconductor memory device according to claim 15, wherein:
- the semiconductor memory device includes $(6m+2) \times n$ transistors, where n is a count of sensing circuits and m is a count of the plurality of data latches included in the latch circuit.

19. The semiconductor memory device according to claim 15, wherein:
- the semiconductor memory device is a NAND flash memory in which memory cells are arranged in two dimensions, or a NAND flash memory in which memory cells are stacked in three dimensions.

* * * * *